United States Patent
Pellin et al.

(10) Patent No.: US 7,625,840 B2
(45) Date of Patent: Dec. 1, 2009

(54) CATALYTIC NANOPOROUS MEMBRANES

(75) Inventors: Michael J. Pellin, Naperville, IL (US); John N. Hryn, Naperville, IL (US); Jeffrey W. Elam, Elmhurst, IL (US)

(73) Assignee: UChicago Argonne, LLC., Chicago, IL (US)

( * ) Notice: Subject to any disclaimer, the term of this patent is extended or adjusted under 35 U.S.C. 154(b) by 793 days.

(21) Appl. No.: 10/941,800

(22) Filed: Sep. 14, 2004

(65) Prior Publication Data

US 2005/0065028 A1    Mar. 24, 2005

Related U.S. Application Data

(60) Provisional application No. 60/503,668, filed on Sep. 17, 2003.

(51) Int. Cl.
| | |
|---|---|
| B01J 20/08 | (2006.01) |
| B01J 20/28 | (2006.01) |
| B01J 20/284 | (2006.01) |
| B01J 20/32 | (2006.01) |
| B01J 35/10 | (2006.01) |
| B01J 37/00 | (2006.01) |
| B01J 37/02 | (2006.01) |
| B05D 1/36 | (2006.01) |
| B05D 3/04 | (2006.01) |
| B05D 3/10 | (2006.01) |
| B05D 7/00 | (2006.01) |
| B82B 3/00 | (2006.01) |

(52) U.S. Cl. .................. 502/439; 502/4; 502/247; 502/248; 502/254; 502/256; 502/259; 502/262; 502/263; 502/332; 502/334; 502/335; 502/337; 502/339; 502/349; 502/351; 502/352; 502/353; 502/354; 502/355; 427/333; 427/402; 427/404; 427/419.2; 427/419.3; 977/890

(58) Field of Classification Search .............. 502/439, 502/4, 247, 248, 254, 256, 259, 262, 263, 502/332, 334, 335, 337, 339, 349–355; 427/333, 427/402, 404, 419.2, 419.3; 977/890
See application file for complete search history.

(56) References Cited

U.S. PATENT DOCUMENTS

4,983,423 A * 1/1991 Goldsmith .................. 427/230

(Continued)

OTHER PUBLICATIONS

Elam et al, ZnO/Al2O3 nanolaminates fabricated by atomic layer deposition: growth and surface roughness measurements, 2002, Thin Solid Films, 414, 43-55.*
George et al, Surface Chemistry for Atomic Layer Growth, 1996, Journal of Physical Chemistry, 100, 13121-13131.*

*Primary Examiner*—Timothy C. Vanoy
*Assistant Examiner*—Serena L Hanor
(74) *Attorney, Agent, or Firm*—Cherskov & Flaynik

(57) ABSTRACT

A nanoporous catalytic membrane which displays several unique features including pores which can go through the entire thickness of the membrane. The membrane has a higher catalytic and product selectivity than conventional catalysts. Anodic aluminum oxide (AAO) membranes serve as the catalyst substrate. This substrate is then subjected to Atomic Layer Deposition (ALD), which allows the controlled narrowing of the pores from 40 nm to 10 nm in the substrate by deposition of a preparatory material. Subsequent deposition of a catalytic layer on the inner surfaces of the pores reduces pore sizes to less than 10 nm and allows for a higher degree of reaction selectivity. The small pore sizes allow control over which molecules enter the pores, and the flow-through feature can allow for partial oxidation of reactant species as opposed to complete oxidation. A nanoporous separation membrane, produced by ALD is also provided for use in gaseous and liquid separations. The membrane has a high flow rate of material with 100% selectivity.

13 Claims, 2 Drawing Sheets

U.S. PATENT DOCUMENTS

| | | | |
|---|---|---|---|
| 5,061,544 A * | 10/1991 | Wada et al. | 428/131 |
| 6,177,373 B1 * | 1/2001 | Sterte et al. | 502/4 |
| 6,239,064 B1 * | 5/2001 | Nguyen et al. | 502/328 |
| 6,471,745 B1 * | 10/2002 | Foley et al. | 95/54 |
| 6,638,859 B2 * | 10/2003 | Sneh et al. | 438/680 |
| 6,740,143 B2 * | 5/2004 | Corbin et al. | 96/11 |
| 6,783,849 B2 * | 8/2004 | Yitzchaik | 428/339 |
| 6,808,803 B1 * | 10/2004 | Yitzchaik | 428/339 |
| 6,875,271 B2 * | 4/2005 | Glenn et al. | 117/89 |
| 2001/0046564 A1 * | 11/2001 | Kotov | 427/430.1 |
| 2002/0115747 A1 * | 8/2002 | Feldheim et al. | 523/201 |
| 2002/0167118 A1 * | 11/2002 | Billiet et al. | 264/432 |
| 2003/0027431 A1 * | 2/2003 | Sneh et al. | 438/758 |
| 2003/0190804 A1 * | 10/2003 | Glenn et al. | 438/689 |

\* cited by examiner

Figure . SEM image at left of original 40 nm AAO material. At right is SEM image of AAO membrane coated with 15 nm of alumina. Note the 10 nm pores which are at the limit of the SEM resolution.

CATALYTIC NANOPOROUS MEMBRANES

This patent application claims the benefits of U.S. Provisional Patent Application No. 60/503,668, filed on Sep. 17, 2003.

CONTRACTUAL ORIGIN OF THE INVENTION

The United States Government has rights in this invention pursuant to contract number W-31-109-ENG-38 between the U.S. Department of Energy and the University of Chicago representing Argonne National Laboratory.

BACKGROUND OF THE INVENTION

1. Field of the Invention

This invention relates to a novel nanoporous membrane catalyst and a process of production of the nanoporous membrane catalyst, and more particularly, this invention relates to a nanoporous catalyst of high reactant conversion rates and a process of production of the catalyst using atomic layer deposition (ALD).

2. Background of the Invention

Selective catalytic oxidation (SCO) remains one of the most desirable and elusive technologies for chemical and fuels processing and environmental protection. Industrial catalysts are generally high surface area substrates onto which an active component is dispersed in the form of very small particles. These particles have typical dimensions of 1 nanometer (nm) to 20 nm and are often referred to as nanoparticles.

Nanoporous catalytic materials, predominantly in the form of zeolites, have gained wide acceptance as industrial catalysts for oil refining, petrochemistry, and organic synthesis, particularly for molecules with kinetic diameters below 1 nm.

There has been little prior work in which nanoporous alumina has been used as a catalyst or as a support for catalytic nanoclusters. Rather, the anodic alumina, as a film or thin shell on an aluminum base, was used directly as a catalyst. subsequently, oxide catalysts were supported on these anodic alumina films, but these works did not employ membrane catalysts.

The use of anodic alumina membranes for deposition of metal nanoparticles into the pores from colloidal solution has been shown in: T. Hanaoka, H. P. Kormann, M. Kroell, T. Sawitowski, G. Schmid, *Three-Dimensional Assemblies Of Gold Colloids In Nanoporous Alumina Membranes*, Eur. J. Inorg. Chem., 807-812 (1998). Similarly, the use of AAO materials for anchoring metal complexes on the pore walls was shown in: P. Braunstein, H. P. Kormann, W. Meyer-Zaika, R. Pugin, and G. Schmid, *Strategies For The Anchoring Of Metal Complexes, Clusters, And Colloids Inside Nanoporous Alumina Membranes*, Chem. Eur. J. 6, 4637-4646 (2000). However, the membranes employed (250 nm pore diameter) were well beyond the nanoscale target dimensions necessary to effect reactions with 1 nm to 10 nm size molecules.

U.S. Pat. No. 6,740,143 awarded to Corbin, et al. on May 25, 2004 discloses a method for the synthesis of nanoporous carbon membranes. The method entails pyrolysis of selected polymers on porous substrates to produce thin mixed matrix carbon film with pores. The carbon film facilitates the separation of small molecules from a reaction liquor.

U.S. Pat. No. 6,471,745 awarded to Foley, et al. on Oct. 29, 2002 discloses catalytic membranes comprising highly-dispersed, catalytically-active metals in nanoporous carbon membranes and a single-phase process to produce the membranes.

U.S. Pat. No. 4,921,823 awarded to Furneaux, et al. on May 1, disclosed a method for the synthesis of nanoporous carbon membranes. The method entails the discloses a porous anodic aluminum oxide membrane catalyst support with pore sizes of 80 nm.

None of the aforementioned patents discloses a nanoporous membrane with pore sizes at least as small as 10 nm and a process for making such nanoporous membranes. In addition, none of these patents discloses a method for creating catalysts of vanadia with nanopores.

A need exists in the art for nanoporous membranes with pore sizes at least as small as 10 nm and a process to make them. Such materials can provide a higher degree of reaction selectivity and a greater complexity and range of catalysts including nanoporous vanadia catalysts.

SUMMARY OF THE INVENTION

It is an object of the present invention to provide a novel nanoporous membrane catalyst and a process of production of the nanoporous membrane that overcomes many of the disadvantages of the prior art.

Another object of the present invention is to provide a process for formation of a nanoporous membrane on a substrate using ALD. A feature of the invention is that pores of anodized aluminum are reduced to sizes less than or equal to 10 nm by the deposition of metal oxide films with ALD. An advantage of the invention is that electronic structure of materials changes in the 1 nm to 10 nm range.

Still another object of the present invention is to provide a process that uses a combination of anodic aluminum oxidation and ALD. A feature of the invention is that porous catalysts can be fabricated which allow for atomic level control of both the pore wall diameters and pore wall composition. This feature allows for the uniform coating of the entire length of the pore's inner surface. An additional feature of the invention is the ability to add layers of a variety of materials, allowing a large number of different types of catalysts to be generated. An advantage of the invention is that the method can provide unique catalyst environments.

Yet another object of the present invention is to provide a process which can produce or form catalytic layers in which the pore diameter reaches sub-nanometer dimensions. A feature of this invention is that molecular-size selectivity can be an important factor in chemical reactions and separations. An advantage of this feature is that selective activation of bonds, e.g., terminal C—H bonds in alkanes, via molecular size selection can be achieved.

Still another object of the present invention is to provide a process which can produce a nanoporous separation membrane. A feature of this invention is that AAO pore sizes can be reduced by the addition of multiple layers using ALD until all the pores are brought to the same consistent and uniform diameter. An advantage of this feature is that the membrane can be made selective for a particular molecular size by controlling the size of reactants (ALD precursors) which coat the inside of pores. An additional advantage of this feature is that it aids in the achievement of uniform catalytic results throughout the membrane.

Yet another object of the present invention is to provide a process which can give shorter contact times between a catalyst and reactant(s). A feature of this invention is that AAO pores can go all the way through the entire thickness of the membrane to create a flow-through catalytic membrane. An advantage of this feature is that the reactant(s) have very brief contact with catalytic material and thus heightens product selectivity, e.g., partial oxidation as opposed to total oxidation.

Briefly, the invention provides a process for making a membrane catalyst having pores at no greater than 10 nm diameters, the process comprising depositing alternating monolayers of different precursor moieties upon a substrate; allowing the monolayers to react with each other to form a first film upon the substrate; depositing a second group of alternating monolayers of the different precursor moieties upon the first film; and allowing the monolayers from the second group to react and form a second film upon the first film.

The invention also provides a nanoporous support material for a catalyst, the nanoporous support material comprising a film deposited upon anodic aluminum oxide (MO) via atomic layer deposition (ALD).

In addition, the invention provides a nanoporous catalyst, the nanoporous catalyst comprising a layer deposited upon a nanoporous support material via atomic layer deposition (ALD).

Further, the invention provides a nanoporous separation membrane comprising multiple layers of film deposited upon anodized aluminum oxide (AAO) via atomic layer deposition (ALD).

BRIEF DESCRIPTION OF THE DRAWINGS

The invention together with the above and other objects and advantages will be best understood from the following detailed description of the preferred embodiment of the invention shown in the accompanying drawing, wherein.

DETAILED DESCRIPTION OF THE INVENTION

Figure 1:
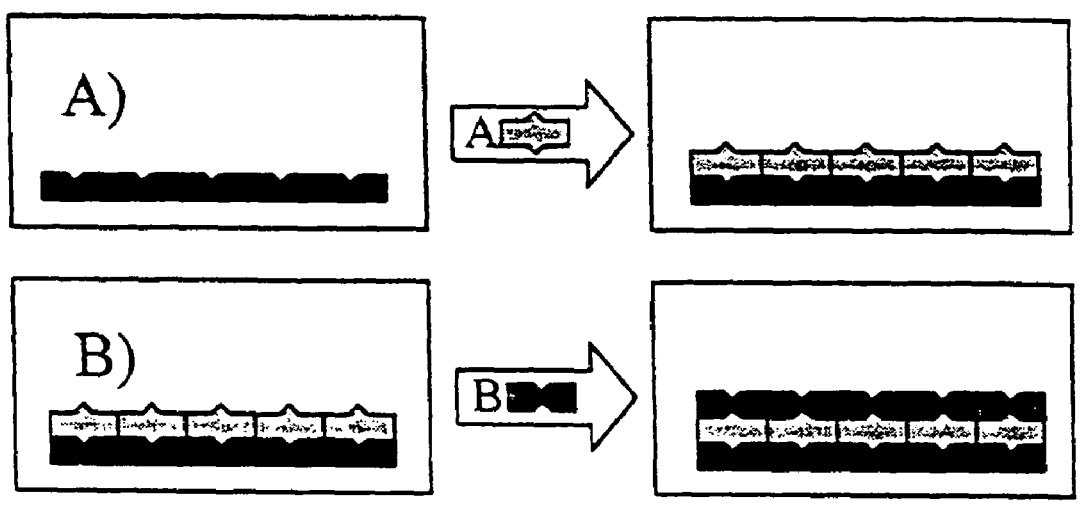
FIG. 1 is a schematic diagram of a binary reaction sequence, in accordance with features of the present invention.

The inventors have produced catalytic membranes that display several unique features, including higher specificities than conventional catalysts. The invention uses anodic aluminum oxide (AAO) membranes as the catalyst substrate. Other suitable substrates include Vanadia catalysts. Supported vanadia catalyst systems are excellent systems for investigating the effect of nanostructure on the activity and selectivity of oxidation catalysts, and offer the prospect of developing a new generation of optimized selective oxidation catalysts.

Where AAO substrates are used, the substrate is subjected to Atomic Layer Deposition (ALD), which allows the controlled narrowing of pores in the substrate by deposition of whatever material is required for catalysis in atomic layers on the inner surface of the pores. In addition to the anodic alumina membranes, tubular ceramic membranes such as the asymmetric gamma-alumina tubular membranes which are commercially available and have a high conductance also may be utilized in this ALD deposition scheme.

The inventors have found that the pores in the substrate can be narrowed from 40 nm to less than or equal to 10 nm using this method. This pore size (referred herein as "nanoporous") is of great interest in catalysis as changes in the electronic structure of materials occur in the 1 nm to 10 nm scale. If desired, the pores can traverse completely through the AAO membrane to the other side to provide a flow-through catalyst.

Initially, the pores can have a nonconstant or varying diameter along their lengths. However, the pore diameters can be made constant, and consistently the same, by the deposition of multilayers via ALD.

Anodic aluminum oxide (AAO)-materials are produced electrochemically at Argonne National Laboratory and are also available commercially. AAO materials have organized arrays of channels with pore diameters as small as 20 nm, pore densities exceeding $1 \times 10^{11}$ $cm^{-2}$ and lengths as long as 70 microns. Selective regions of the channels, or the entire channel, can be repeatedly coated with nearly any pure or mixed-metal oxide (including alumina), carbide, nitride or metallic film. This coating process is performed using ALD techniques to assure uniform pores of arbitrary diameter and composition. AAO pore diameters can be narrowed from their starting diameter of 20 nm to 200 nm to dimensions as small as ~1 nm. This size range encompasses much of the most interesting catalytic dimensionality. For instance, the inventors surmise that the pore wall electronic structure change significantly as a function of pore diameter in the 1 nm to 10 nm range.

By manipulating processing conditions during the manufacture of AAO membranes, the diameter of the cylindrical MO pores can be chosen to be anywhere between 30±1 nm and 200±3 nm. ALD can be used to produce a membrane structure with ultra-uniform pore sizes with an extremely narrow pore size distribution, within 0.1 nm. The ALD process is continued until the smallest reactants (ALD precursor moieties) can no longer pass through the shrinking pores of the AAO membrane, thereby setting a lower limit on pore size. However, the ALD process continues in the larger-diameter pores until all the pores constrict to the same diameter, resulting in an extremely narrow pore size distribution. Furthermore, the ultimate size of the pores can be controlled by choosing the size of the precursor moieties which coat the inside of the pores. Thus, one can fine-tune the pore size of a particular AAO membrane to be the size of a specific molecule to be separated by selecting ALD precursors of suitable size.

The inventors have found that using a combination of anodic aluminum oxidation (AAO) and atomic layer deposition (ALD) affords a facile, flexible route to the synthesis of ultra-uniform heterogeneous catalytic membranes. The inventors further found that the ALD process coats the entire length of the pore inner surface uniformly to the same coating thickness, not only on an individual pore's inner surfaces, but in all pores and nonporous surfaces of the support surface. This capability allows atomic level control of both the pore wall diameters and pore wall composition.

An additional feature of the invention is the ability to add layers of a variety of materials, allowing a large number of different types of catalysts to be generated. Thus, the invention is versatile in terms of the catalysts that the invention can produce.

These materials are membranes which offer unique catalyst environments which: 1) provide larger pores than conventional mesoporous materials (for containing large clusters or arrays of catalyst sites, for efficient in-diffusion of large/elaborate molecular precursors or feedstock molecules, and for out-diffusion of large/elaborate product molecules); 2) permit tailoring of channel size and wall composition by ALD (including channel surfaces with hydrophobic, or hydrophilic nature); 3) constrain catalyst mobility, thus hindering agglomeration; and 4) control flow of reagents in and out of the catalyst.

The inventors have found that nanoporous materials can be made by using a reactor which provides a continuous and viscous flow of inert carrier gas to transport precursor reactant moieties to the sample substrates, and to purge or sweep the unused precursor reactant moieties out of the reaction zone.

Film deposition on substrates is also feasible using short-duration pulses of pure precursor moiety gases without any inert carrier gas.

The amount of precursor moiety gas required is empirically determined to saturate the active sites on the substrate surface. The saturation aids to insure dense, smooth, pinhole-free films, which are defect-free and continuous. The deposition is self-limiting. Once a monolayer of one moiety is formed, additional exposure to that same moiety results in no substantial additional deposition. Only exposure to a second moiety, which is reactive towards the first moiety deposited on the substrate surface, results in the allowance and creation of any additional surface activity. This process is repeated and multiple layers are formed upon the substrate.

Synthesis of the nanoporous catalytic membranes begins with the production of Anodic Aluminum Oxide (AAO) membranes produced electrochemically. The membranes have highly aligned, uniform-diameter pores from 20 to 400 nm in diameter and membrane thicknesses of 0.5 microns to 70 microns.

To deposit a preparatory layer upon the AAO substrate, two different precursor moieties are needed. One of the two different precursor moieties is selected from the group consisting of titanium tetrachloride ($TiCl_4$), titanium (IV) isopropoxide ($Ti(i-C_3H_7)_4$), tin (IV) chloride ($SnCl_4$), tetraethyl tin ($Sn(C_2H_5)_4$), trimethyl aluminum (($CH_3)_3Al$), and silicon tetrachloride ($SiCl_4$). The other of the two different precursor moieties is selected from the group consisting of water, oxygen ($O_2$), ozone ($O_3$), hydrogen peroxide ($H_2O_2$), isopropanol ($CH_3CHOHCH_3$), and air. Multiple layers of these two precursor moieties are laid down upon the substrate and each other in the ABAB fashion described supra.

The preparatory film that results from these two different precursor moieties is selected from the group consisting of aluminum oxide (alumina/$Al_2O_3$), titanium (IV) oxide (titania/$TiO_2$), tin (IV) oxide (stannia/$SnO_2$) and silicon (IV) oxide (silica/$SiO_2$).

For deposition of a catalyst layer within the pores, one of the two different precursors needed is selected from the group consisting of vanadium (V) isopropoxide oxide ($V(i-C_3H_7)_3O$), chromium (III) acetyl acetonate ($Cr(C_5H_7O_2)_3$), nickel (II) acetyl acetonate ($Ni(C_2H7O_2)_2$), vanadyl acetyl acetonate ($VO(C_2H_7O_2)_2$), bis(cyclopentadienyl) ruthenium ($Ru(C_5H_5)_2$), and methylcyclopentadienyltrimethyl platinum (($C_6H_7)Pt(CH_3)_3$).

The other of the two different precursor moieties is selected from the group consisting of water, oxygen (O2), ozone ($O_3$), hydrogen peroxide ($H_2O_2$), isopropanol ($CH_3CHOHCH_3$), and air.

In the aforementioned manner, multiple layers of these two different precursor moieties are laid down in a successive ABAB . . . fashion in which the A and B moieties alternate. Each pair of A and B layers react to form multiple layers of the same film material. The nanoporous catalytic layer that results from the reaction of these different precursor moieties is selected from the group consisting of vanadium (V) oxide (vanadia/$V_2O_5$), chromium oxide ($CrO_x$), nickel (Ni), platinum (Pt), and ruthenium (Ru).

A salient feature of the instant invention is that the catalytic layer is deposited uniformly on the inner surfaces of the pores of the nanoporous support material and allows for greater catalytic selectivity.

Another salient feature is uniform and consistent pore size which gives consistent performance through all dimensions of each catalyst produced by the instant invention.

An additional salient feature of the invention is the production of a nanoporous separation membrane comprising multiple layers of film deposited upon anodized aluminum oxide (AAO) via atomic layer deposition (ALD). The AAO membrane initial pore sizes can be reduced to the size of a particular molecule to be separated. The resulting membrane can be used in gaseous and liquid separation.

Deposition Protocol

Atomic layer deposition (ALD) is a thin film growth technique that uses a binary reaction sequence of alternating, saturating reactions between gaseous precursor molecules and a substrate to deposit films in a layer-by-layer fashion. This is described in: S. M. George, A. W. Ott, J. W. Klaus, *Surface Chemistry for Atomic Layer Growth*, Journal of Physical Chemistry 100, 13121-13131 (1996).

ALD relies on the gaseous diffusion of precursor moiety molecules to reach all regions of the substrate. This quality, combined with the self-limiting surface chemistry that terminates after the completion of the deposition of each monolayer, allows substrates with extremely high aspect ratios, such as cylindrical objects, to be coated thoroughly and uniformly. This feature has been put to great advantage, e. g., production of conformal coatings on AAO membranes as is shown in: J. W. Elam, D. Routkevich, P. P. Mardilovich, and S. M. George, *Conformal Coating of Ultrahigh Aspect Ratio Anodic Alumina Membranes By Atomic Layer Deposition*, Chemistry of Materials 15, 3507-3517 (2003).

By repeating the binary reaction sequence in an ABAB fashion, films of micron thickness can be deposited with atomic layer precision. FIG. 1 depicts this scenario. Moiety A is deposited onto the surface with the subsequent deposition of moiety B. Exposing the surface to reactant moiety A results in the self-limiting adsorption of a monolayer of the A specie. The resulting surface becomes the starting substrate for reaction with reactant moiety B. Subsequent exposure to moiety B covers the surface with a monolayer of B specie. A reaction then takes place between the two species to form a monolayer of desired product. Any byproducts of the surface reaction are swept away by the inert carrier gas. Current viscous flow ALD reactor designs allow this monolayer by monolayer growth to proceed very rapidly, resulting in growth rates as high as 1 micron per hour. ALD allows for digital control of the film thickness at the monolayer level.

Binary reaction sequences have been developed to deposit a wide variety of materials including oxides, nitrides, sulfides and metals. ALD composite oxides are formed by depositing alternating layers or partial layers of the component oxides at a specific ratio that controls the composition of the composite layer. This kind of ALD system has been reported by the inventors. J. W. Elam, M. D. Groner, and S. M. George, *Viscous Flow Reactor with Quartz Crystal Microbalance for Thin Film Growth by Atomic Layer Deposition*, Reviews of Scientific Instruments, 73 (8), 2981-2987 (August 2002), and incorporated herein by reference.

The precursor moieties can be solids, liquids, or gases at room temperature. If necessary, the vapor pressure of the precursor moieties can be increased by heating the precursor moieties, usually to less than 200° C. A target substrate(s) is loaded into a reaction chamber through a sample loading area.

The entire system is then evacuated by mechanical vacuum pumps, which are left running through the entire process.

An inert gas such as nitrogen is allowed to flow through the system, with the system remaining at a pressure of ~1 Torr for the duration of the complete deposition. Once a substrate(s) is loaded into a flow tube, and the system evacuated, a continuous gas flow is established. The substrate is subsequently heated to a preselected temperature. Reaction zone temperatures range typically of from about 200° C. to 400° C. Lower temperatures such as 100° C. can be used if the precursor moiety has sufficient vapor pressure at that temperature.

Once the preselected temperature has been attained, the first gaseous precursor moiety is allowed to enter, as a pulse of pure gas, or with an inert gas such as nitrogen acting as a carrier, into the reaction zone. Total gas pressure is typically ~1 Torr. The carrier gas flow rate ranges from about 3 to 20 liters per hour. The precursor gas pulse duration ranges from of about one-hundredth (0.01) of a second to 10 second (sec). A pulse of the first precursor moiety can be followed immediately by a pulse of the next precursor moiety, either from the same fluid stream or from different ingress portals. Each pulse is self-purging. In the event of pulses of pure gaseous precursor moieties, a purge pulse of inert carrier gas intervenes between pulses of pure precursor moieties.

The inert carrier gas flow subsequently transports the precursor moieties to the reaction zone and sweeps the unused reactants and unadsorbed reaction products out of the reaction zone. Since the mechanical vacuum pumps are continually running, the chemical moieties go through the pumps which vent into a burning box, in which the materials are destroyed, and the box then vents into the atmosphere.

When using ALD to coat interior surfaces of anodic alumina membranes having a high aspect ratio L/d where L is the membrane thickness and d is the pore diameter, longer precursor exposure times are necessary relative to the precursor exposure times needed to coat a flat substrate. These longer exposure times are needed to allow the precursor molecules sufficient time to diffuse completely into the centers of the pores. The minimum precursor exposure time necessary to achieve a continuous coating can be calculated from Equation 1.

$$t = 6.9 \times 10^{-7} P^{-1} m^{1/2} \tilde{A} (L/d)^2 \qquad \text{Equation 1}$$

In this formula, t is the exposure time in seconds, P is the precursor vapor pressure in Torr, m is the precursor moiety molecular weight in amu, $\tilde{A}$ is the density of ALD reactive sites in $10^{15}$ cm$^{-2}$, and L and d have units of nanometer (nm). This formula is taken from J. W. Elam, D. Routkevich, P. P. Mardilovich, and S. M. George, *Conformal Coating of Ultrahigh Aspect Ratio Anodic Alumina Membranes By Atomic Layer Deposition*, Chemistry of Materials 15, 3507-3517 (2003) at 3516, the entire reference of which is incorporated herein by reference. The constant in Equation 1, 6.9×10$^{-7}$, is determined empirically and includes a margin of safety of a factor of 3 to account for non-idealities (i.e., constrictions) in the AAO membrane. For example, to coat an AAO membrane having d=10 nm and L=7×10$^4$ nm (70 microns) by Al$_2$O$_3$, ALD ($\tilde{A}$=0.46) using trimethyl aluminum (TMA, m=72) at a pressure of 1 Torr requires a minimum exposure time of t=132 sec. Furthermore, as the AAO membrane is located with successive ALD layers, the pore diameter, d, decreases and consequently the minimum exposure time increases. The very long ALD exposure times necessary to coat the high aspect ratio AAO membranes are impractical using the continuous flow ALD reactor scheme described supra inasmuch the precursor reservoirs are rapidly depleted, and the continuous pumping does not allow for high precursor vapor pressures in the reactor flow tube. Thus, the viscous flow ALD reactor can be operated in a quasi-static mode for the highest ratio membranes requiring exposure times longer than approximately 10 sec.

Quasi-Static Mode Example Using Al$_2$O$_3$ ALD

An exhaust valve is installed between the reactor flow tube and the exhaust mechanical pump. During each cycle for Al$_2$O$_3$ ALD, the flow tube is first evacuated below 0.035 Torr. The exhaust valve is then closed and 1 to 10 Torr of TMA is Introduced into the reactor. After waiting for the appropriate TMA exposure time, t, determined by Equation 1 supra, the exhaust valve is opened and the flow tube is evacuated below 0.035 Torr. A nitrogen purge flow of 200 standard cubic centimeters per minutes (sccm) at a pressure of 1 Torr is subsequently supplied for a period of 2t sec. The same sequence is repeated for the water deposition half-cycle using a water pressure of 1 to 10 Torr and an exposure time of t sec. This process is repeated for each AB cycle during Al$_2$O$_3$ ALD.

The thickness of a typical deposited monolayer resulting from one AB reaction cycle is of from about 0.75 angstrom (Å) [7.5 nanometers (nm)] to 5 Å (50 nm). The thickness of a typical hybrid or reaction product layer is of from about 1.5 Å (15 nm) to 10 Å (100 nm). Specific thicknesses of layers are dependent, however, upon the nature of the deposited substance.

The following example is only to illustrate how a reaction is carried out between two precursors to leave a monolayer of product on a substrate, e. g., one method of depositing a monolayer of alumina, Al$_2$O$_3$, on a substrate such as AAO.

Deposition Example

Consider the following binary A-B reaction cycle, illustrated by Equations 2 and 3, for the ALD of alumina (Al$_2$O$_3$) via the reaction of trimethyl aluminum (TMA) with hydroxyl (OH).

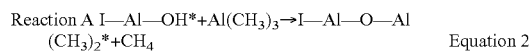

Reaction A I—Al—OH*+Al(CH$_3$)$_3$→I—Al—O—Al(CH$_3$)$_2$*+CH$_4$     Equation 2

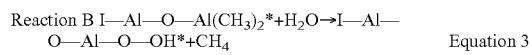

Reaction B I—Al—O—Al(CH$_3$)$_2$*+H$_2$O→I—Al—O—Al—O—OH*+CH$_4$     Equation 3

In Equations 2 and 3, the asterisks designate moieties adsorbed to the substrate surface, the I— indicates the substrate surface, and the equations have been simplified to show only one surface active site. The actual scheme involves several active sites at once. In Equation 2, the substrate (e. g., AAO) surface is initially covered with hydroxyl (OH) moieties deposited by exposure of the substrate surface to water. The hydroxyl moieties react with TMA to deposit a monolayer of aluminum atoms that are terminated by methyl (CH$_3$) species, and releasing methane (CH$_4$) as a reaction byproduct. This methane can be shunted to a reclamation system to protect the system. TMA is not reactive to the methyl termini protruding from the now covered surface. Thus, due to the methyl termini, additional exposure of this surface to TMA gives no additional growth on the surface beyond the one monolayer already present on the surface.

In Equation 3, subsequent exposure of this new surface to water displaces the methyl moiety, and leaves a hydroxyl in its place. The hydroxyl reacts with a pulse of fresh TMA and creates another monolayer of Al—O ionic bonds. Methane is once again released as a byproduct. The net effect of one AB cycle is to deposit one monolayer of alumina on the substrate surface. Multiple cycles produce multiple layers.

Figure 2:
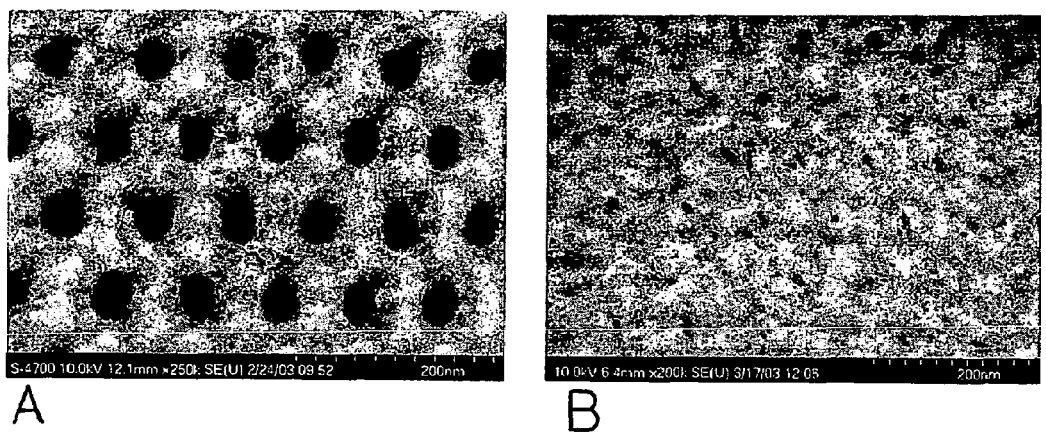
FIG. 2A is a schematic diagram of a SEM image of anodized aluminum oxide (AAO) material before being coated.
FIG. 2B is a schematic diagram of a SEM image of the same anodized aluminum oxide (AAO) material after being coated with 15 nm of alumina ($Al_2O_3$).

FIG. 2A displays a secondary electron micrograph of an AAO membrane, with pore diameters of approximately 40 nm, before ALD deposition. The pores go completely through the thickness of the membrane. FIG. 2B displays the same membrane with pores of diameter 10 nm, after deposition of a 15 nm layer of $Al_2O_3$ by ALD. The holes in FIGS. 2A and 2B are the pores.

Temperatures of about 250° C. are preferred for depositing titania ($TiO_2$) films on flat surfaces. A reaction zone temperature of 250° C. in that situation produces denser and more crystalline films.

However, while reaction zone temperatures of from about 200° C. to 400° C. have been disclosed herein, the inventors have found that lower reaction zone temperatures can give optimal results. Specifically, the inventors have developed methods for depositing conformal $TiO_2$ films inside of the AAO substrate nanopores using alternating exposures to titanium tetrachloride and water at a deposition temperature of 100 C. For ALD of titania in AAO, a lower reaction zone deposition temperature of about 100° C. allows for the formation of amorphous titania films which are smoother than crystalline anatase films, the later of which form at 250° C. The lower deposition temperature serves as a means to prevent formation of large anatase $TiO_2$ nanocrystals which cause surface roughness and block the AAO nanopores to further gas transport. These smoother amorphous titania films aid in keeping the AAO nanopores open to gas transport and gas throughput. Even at this lower temperature of 100° C., nucleation of titania via ALD occurs readily on the ALD $Al_2O_3$ surface. Accordingly, titania formation occurs without delay.

The inventors have also developed methods for depositing conformal vanadia ($V_2O_5$) films by ALD using alternating exposures to vanadyl trisisopropoxide ($VO[(CH_3)_2CHO]_3$ and a 30% aqueous solution of hydrogen peroxide ($H_2O_2$) at a reaction zone temperature of approximately 100° C. These conditions yield an ALD vanadia growth rate of 0.41 Å/(A-B) exposure cycle which is higher than the growth rate using alternating (A-B) vanadyl trisisoproxide ($VO[(CH_3)_2CHO]_3$/ water exposures. This deposition method serves as a means for depositing small (less than 2-3 Angstrom) sub-monolayer quantities of catalytic $V_2O_5$ on the $TiO_2$ catalytic support layer.

Catalyst Example

An approximate monolayer of vanadium oxide was formed on the aforementioned AAO membrane by impregnation to a loading of 12 micromoles of vanadia per square meter ($V_2O_5$/ $m^2$). This flow-through membrane catalyst was compared with two conventional $V_2O_5$ catalysts supported on a high surface area alumina for the oxidative dehydrogenation of cyclohexane at 450° C. The 20 wt. % $V_2O_5/Al_2O_3$ catalyst has a similar monolayer coverage of vanadia (12 micromole $V_2O_5/m^2$), and the 1 wt. % $V_2O_5/Al_2O_3$ catalyst was chosen to obtain a conventional vanadia catalyst with a conversion rate comparable to the conversion rate of the vanadia-AAO membrane catalyst.

As shown in Table 1 infra, the AAO-supported $V_2O_5$ catalyst exhibited much higher selectivity for the partial oxidation product, cyclohexene, than either of the conventional catalysts. The inventors surmise this reflects the short contact time of the reagents in the flow-through membrane channels which limits the secondary oxidation reactions which would produce benzene ($C_6H_6$), carbon monoxide (CO), and carbon dioxide ($CO_2$). The reagents have only one quick pass at/on the catalytic material as the reagent molecules will most likely pass through the catalytic pores.

The $V_2O_5$/AAO catalyst exhibits exceptionally high selectivity toward the first oxidation product, cyclohexene, compared to the 1% $V_2O_5/Al_2O_3$ catalyst for the same conversion. The inventors surmise this reflects the comparative absence of secondary reactions in the AAO-based catalyst, and thus the selectivity of the catalyst.

TABLE 1

Conversion and Selectivity for catalytic oxidation of cyclohexane by conventional and AAO supported V2O5 catalysts[a]

|  | 1% $V_2O_5/Al_2O_3$ | 20% $V_2O_5/Al_2O_3$ | 0.1% $V_2O_5/Al_2O_3$/AAO |
|---|---|---|---|
| Surface density[b] | 0.6 | 12 | 12 |
| Flow rate[c] | 100 | 100 | 50 |
| $O_2$:Cyclohexane Ratio | 1.5 | 1.6 | 1.2 |
| Total Conversion (%) | 3.3 | 32.4 | 3.2 |
| Cyclohexene (%)[d] | 28.5 | / | 56.0 |
| Benzene (%)[d] | 12.2 | 36.4 | / |
| CO (%)[d] | 25.3 | 22.5 | 14.6 |
| $CO_2$ (%)[d] | 33.9 | 41.1 | 29.3 |

[a]at 450° C.
[b]micromole of $V_2O_5/m^2$.
[c]milliliters per minute (ml/min).
[d]specie percentage of total conversion.

$V_2O_5$/AAO is an active catalyst and formation of products can be detected after a single pass of the reagents through the membrane and without concentrating the product in a cold trap.

The pores of anodized aluminum are reduced to sizes less than or equal to 10 nm by the deposition of metal oxide films with ALD. The electronic structure of materials changes in the 1 nm to 10 nm range.

Flow-through catalytic membranes with pores acting as reactant channels can be made.

The flow-through feature can allow for control of the extent of reaction such as partial hydrogenation of reactant species as opposed to complete hydrogenation.

The pore diameter reduction allows tailoring of channel size and the layer deposition allows alteration of wall composition.

The invention uses a process which is a combination of anodic aluminum oxidation and ALD.

There are no physical limitations on the types of catalysts which can be deposited on coated AAO.

Porous catalysts can be fabricated which allow for atomic level control of both the pore wall diameters and pore wall composition.

There is uniform coating of the entire length of the pore inner surface. Pores of uniform and consistent diameter can be produced. This allows for consistently identical results throughout the catalyst.

The process's operating temperature is typically of from about 200° C. to 400° C., but can be used at lower temperatures if the precursor moieties's vapor pressures so permit. A large number of different types of catalysts can be generated. The invention can provide unique catalyst environments.

While the invention has been described with reference to details of the illustrated embodiments, these details are not intended to limit the scope of the invention as defined in the appended claims.

The embodiment of the invention in which an exclusive property or privilege is claimed is defined as follows:

1. A process for making a flow through catalytic membrane having pores at no greater than 10 nm diameters, the process comprising:

a) depositing alternating monolayers of different precursor moieties upon a substrate, which is supplied with pores which traverse completely through the substrate;
b) allowing the monolayers to react with each other to form a first film upon the substrate, and along the entire length of the pores;
c) depositing a second group of alternating monolayers of the different precursor moieties upon the first film; and
d) allowing the monolayers from the second group to react and form a second film upon the first film.

2. The process as recited in claim 1 wherein the substrate is anodic aluminum oxide.

3. The process as recited in claim 1 wherein precursor moieties are selected from the group consisting of titanium tetrachloride, titanium (IV) isopropoxide, tin (IV) chloride, tetraethyl tin, trimethyl aluminum, silicon tetrachloride, vanadium (V) isopropoxide oxide, chromium (III) acetyl acetonate, nickel (II) acetyl acetonate, vanadyl acetyl acetonate, bis(cyclopentadienyl) ruthenium, methylcyclopentadienyltrimethyl platinum, and combinations thereof.

4. The Process as recited in claim 1 wherein the pore diameter of the membrane is the size of the smallest precursor moiety.

5. The process as recited in claim 1 wherein one of the precursor moieties is selected from the group consisting of water, oxygen, ozone, hydrogen peroxide, isopropanol, air, and combinations thereof.

6. The process as recited in claim 1 wherein a first monolayer for the first film is deposited, the first monolayer comprising a precursor moiety selected from the group consisting of titanium tetrachloride, titanium (IV) isopropoxide, tin (IV) chloride, tetraethyl tin, and trimethyl aluminum, silicon tetrachloride, and combinations thereof.

7. The process as recited in claim 1 wherein a second monolayer for the first film is deposited, the second monolayer selected from the group consisting of water, oxygen, ozone, hydrogen peroxide, isopropanol, air and combinations thereof.

8. The process as recited in claim 1 wherein the first film is selected from the group consisting of aluminum oxide (alumina/$Al_2O_3$), titanium (IV) oxide (titania/$TiO_2$), tin (IV) oxide (stannia/$SnO_2$), and silicon (IV) oxide (silica/$SiO_2$).

9. The process as recited in claim 1 wherein a first monolayer for the second film is deposited, the first monolayer comprising a precursor moiety selected from the group consisting of vanadium (V) oxide (vanadia/$V_2O_5$), chromium (III) acetyl acetonate ($Cr(C_5H_7O_2)_3$, nickel (II) acetyl acetonate ($Ni(C_5H_7O_2)_2$), vanadyl acetyl acetonate ($VO(C_5H_7O_2)_2$), bis(cyclopentadienyltrimethyl platinum (($C_6H_7$)Pt($CH_3$)$_3$).

10. The process as recited in claim 1 wherein a second monolayer for the second film is deposited, the second monolayer selected from the group consisting of water, oxygen, ozone, hydrogen peroxide, isopropanol, air and combinations thereof.

11. The process as recited in claim 1 wherein the second film is selected from the group consisting of vanadium (V) oxide (vanadia/$V_2O_5$), chromium oxide, nickel (Ni), platinum (Pt), and ruthenium (Ru).

12. The process as recited in claim 1 wherein the process is carried out at temperatures of from about 100° C. to 400° C.

13. The process as recited in claim 1 wherein a minimum exposure time necessary to achieve a continuous coating of the first film and second film is calculated from the following equation $$t=6.9\times10^{-7}P^{-1}m^{1/2}\tilde{A}(L/d)^2$$

wherein t is the exposure time in second, P is the precursor vapor pressure in Torr, m is the precursor moiety molecular weight in amu, $\tilde{A}$ is the density of ALD reactive sites in $10^{15}$ cm$^{-2}$, L is the membrane thickness, d is the pore diameter, and L and d have units of nanometers.

* * * * *